(12) United States Patent
Drori

(10) Patent No.: US 6,522,104 B1
(45) Date of Patent: Feb. 18, 2003

(54) METHOD AND APPARATUS FOR MEASUREMENT OF CHARGE IN A BATTERY

(75) Inventor: Joseph Drori, San Jose, CA (US)

(73) Assignee: Xicor, Inc., Milpitas, CA (US)

( * ) Notice: Subject to any disclaimer, the term of this patent is extended or adjusted under 35 U.S.C. 154(b) by 12 days.

(21) Appl. No.: 09/620,090

(22) Filed: Jul. 20, 2000

Related U.S. Application Data

(60) Provisional application No. 60/159,227, filed on Oct. 13, 1999.

(51) Int. Cl.$^7$ ................................................. H02J 7/04
(52) U.S. Cl. ........................................ 320/149; 320/137
(58) Field of Search .............................. 320/149, 137, 320/162, 152, 157

(56) References Cited

U.S. PATENT DOCUMENTS

| | | | |
|---|---|---|---|
| 5,526,215 A | 6/1996 | Higashijima et al. | 361/86 |
| 5,600,247 A | 2/1997 | Matthews | 324/426 |
| 5,631,537 A | 5/1997 | Armstrong | 320/118 |
| 5,648,715 A | 7/1997 | Patino et al. | 320/152 |
| 5,703,463 A | 12/1997 | Smith | 320/134 |
| 5,777,454 A | 7/1998 | McAndrews et al. | 307/66 |
| 5,896,025 A | 4/1999 | Yamaguchi et al. | 320/134 |
| 5,977,751 A | 11/1999 | Blessing et al. | 320/134 |
| 6,037,750 A | 3/2000 | Von Novak | 320/132 |
| 6,047,380 A | 4/2000 | Nolan et al. | 713/324 |
| 6,052,006 A | 4/2000 | Talaga, Jr. et al. | 327/143 |
| 6,154,012 A | * 11/2000 | Drori | 320/162 |

FOREIGN PATENT DOCUMENTS

EP  0 871 273 A1  10/1998

OTHER PUBLICATIONS

International Search Report, PCT/US 00/28429, Jan. 16, 2001.

* cited by examiner

*Primary Examiner*—Edward H. Tso
*Assistant Examiner*—Lawrence Luk
(74) *Attorney, Agent, or Firm*—Fish & Richardson P.C.

(57) ABSTRACT

An integrated power and sense device provides a current used in measuring the charge of a rechargeable battery. The charge measurement apparatus for a rechargeable battery powered system includes an integrated power and sense device having a power device and a sense device, connected to the rechargeable battery and a load; the sense device operatively coupled to provide a mirror current that is a fixed ratio of the current in the power device, and a first circuit that uses the mirror current to measure the charge in the rechargeable battery.

32 Claims, 5 Drawing Sheets

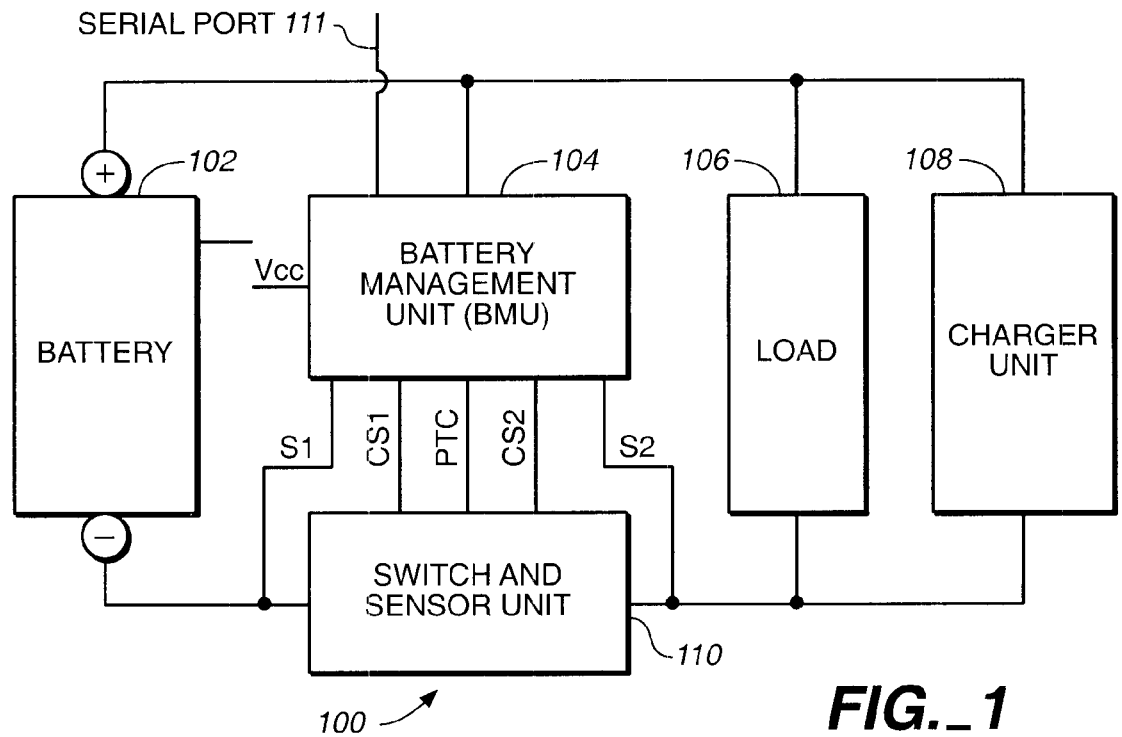
FIG._1
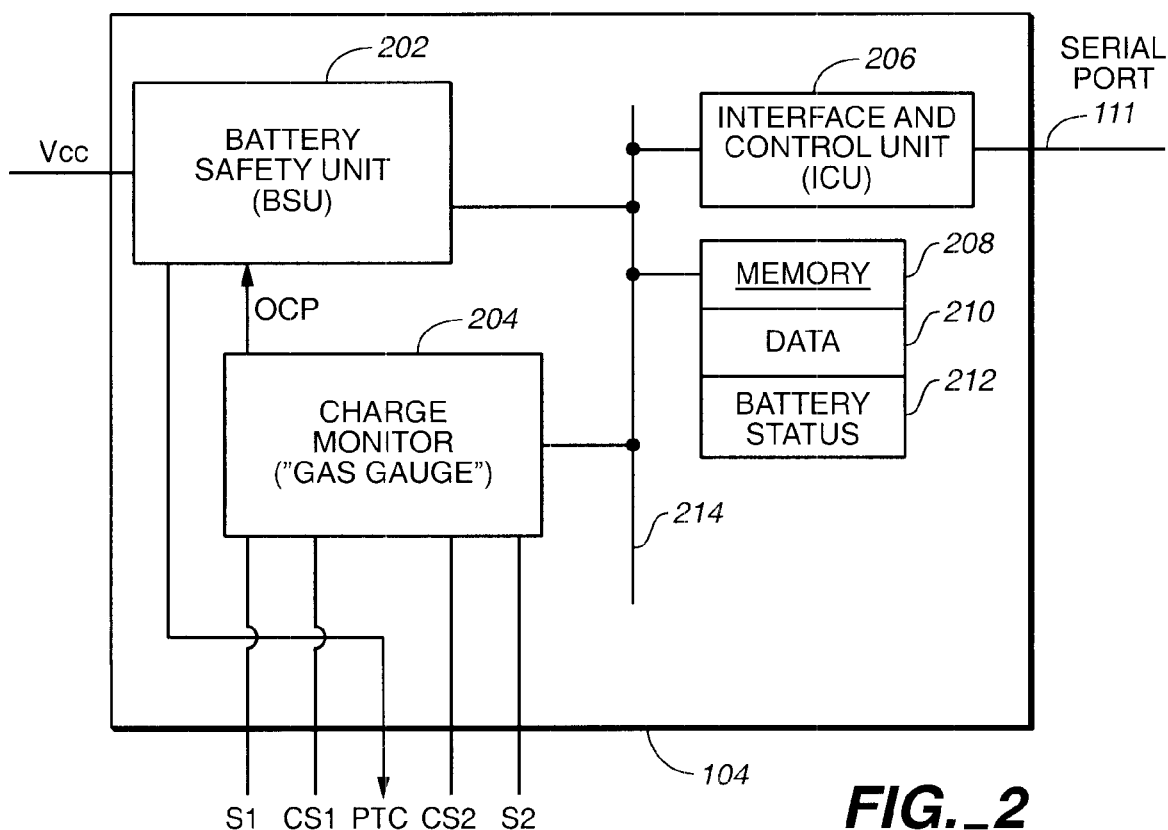
FIG._2

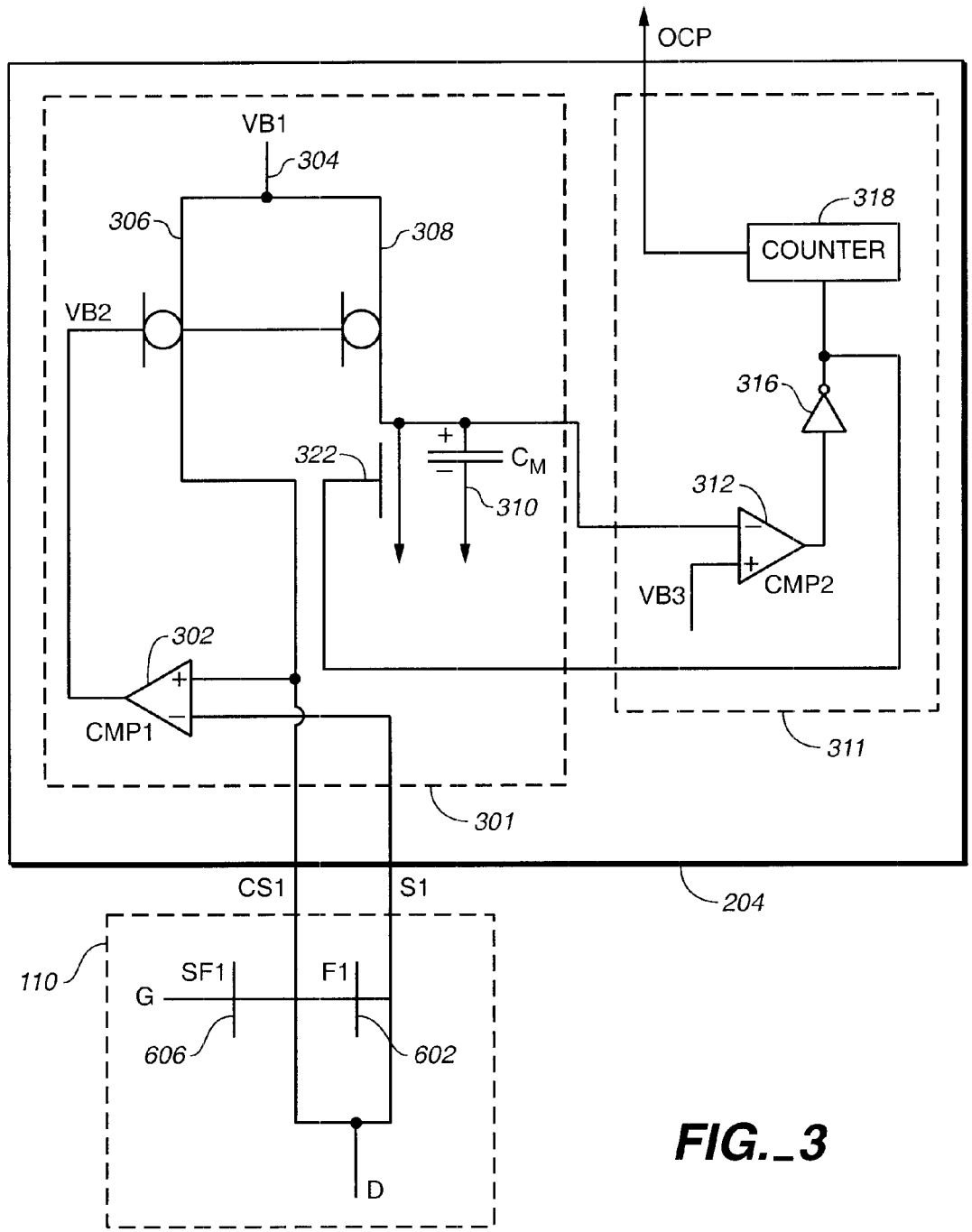
FIG._3

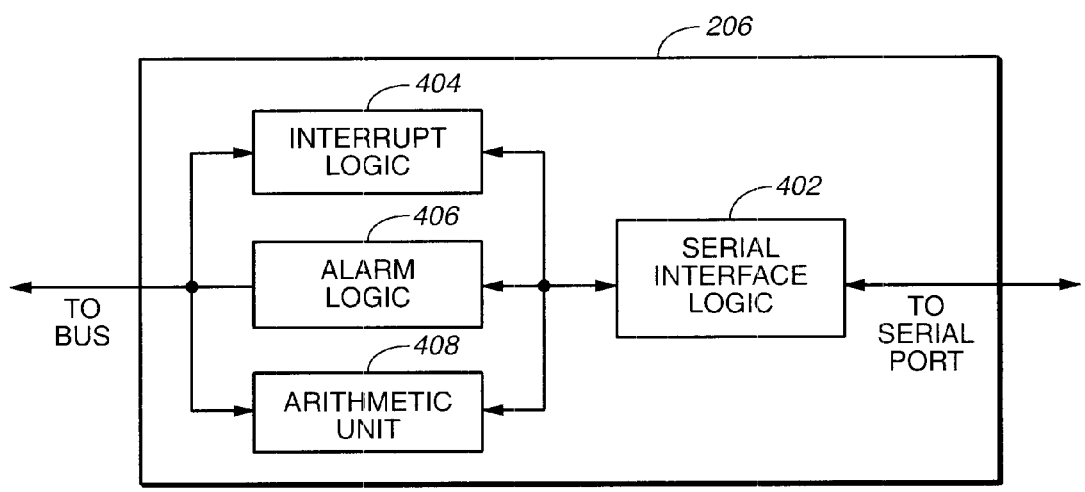
FIG._4

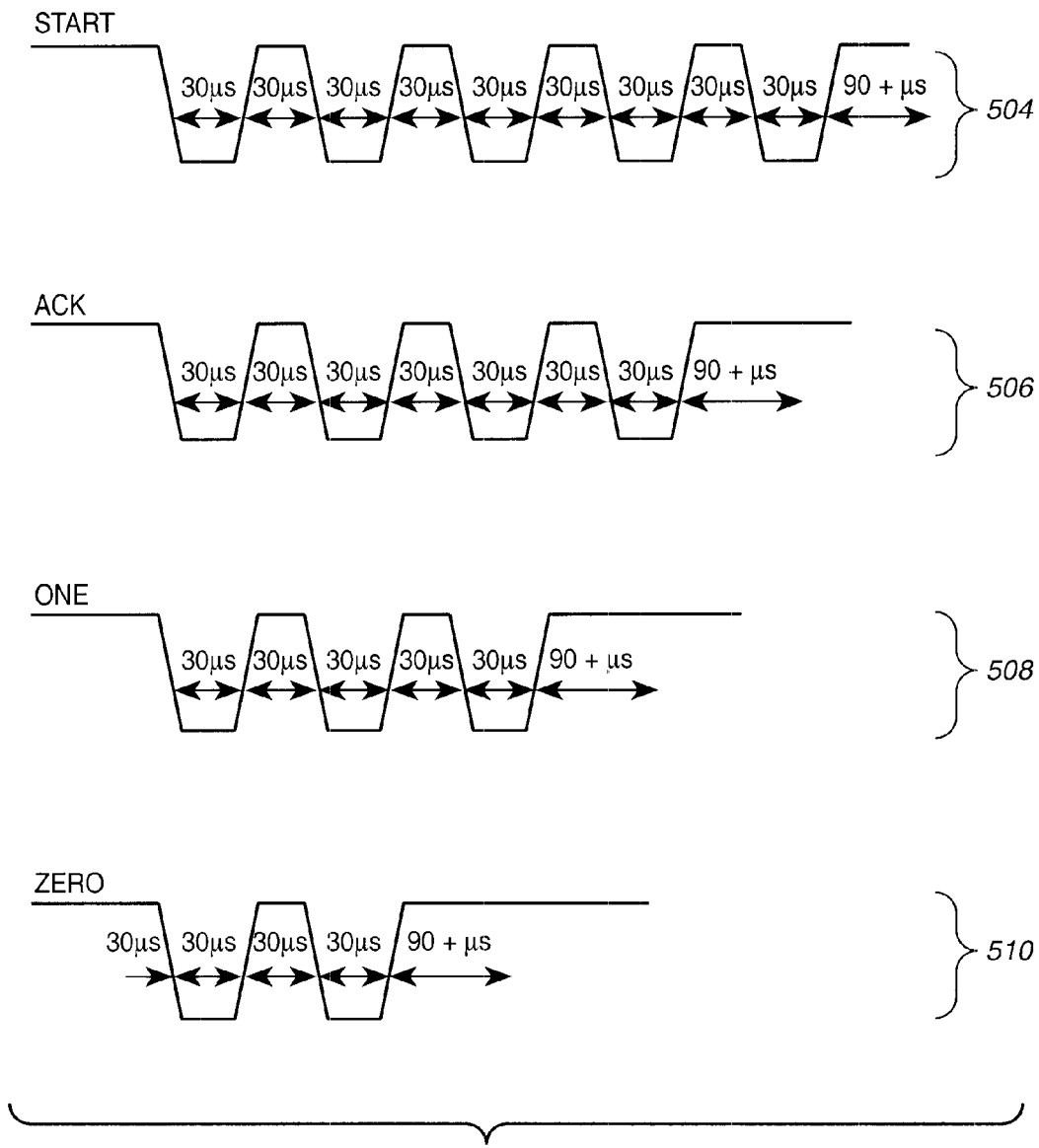
FIG._5

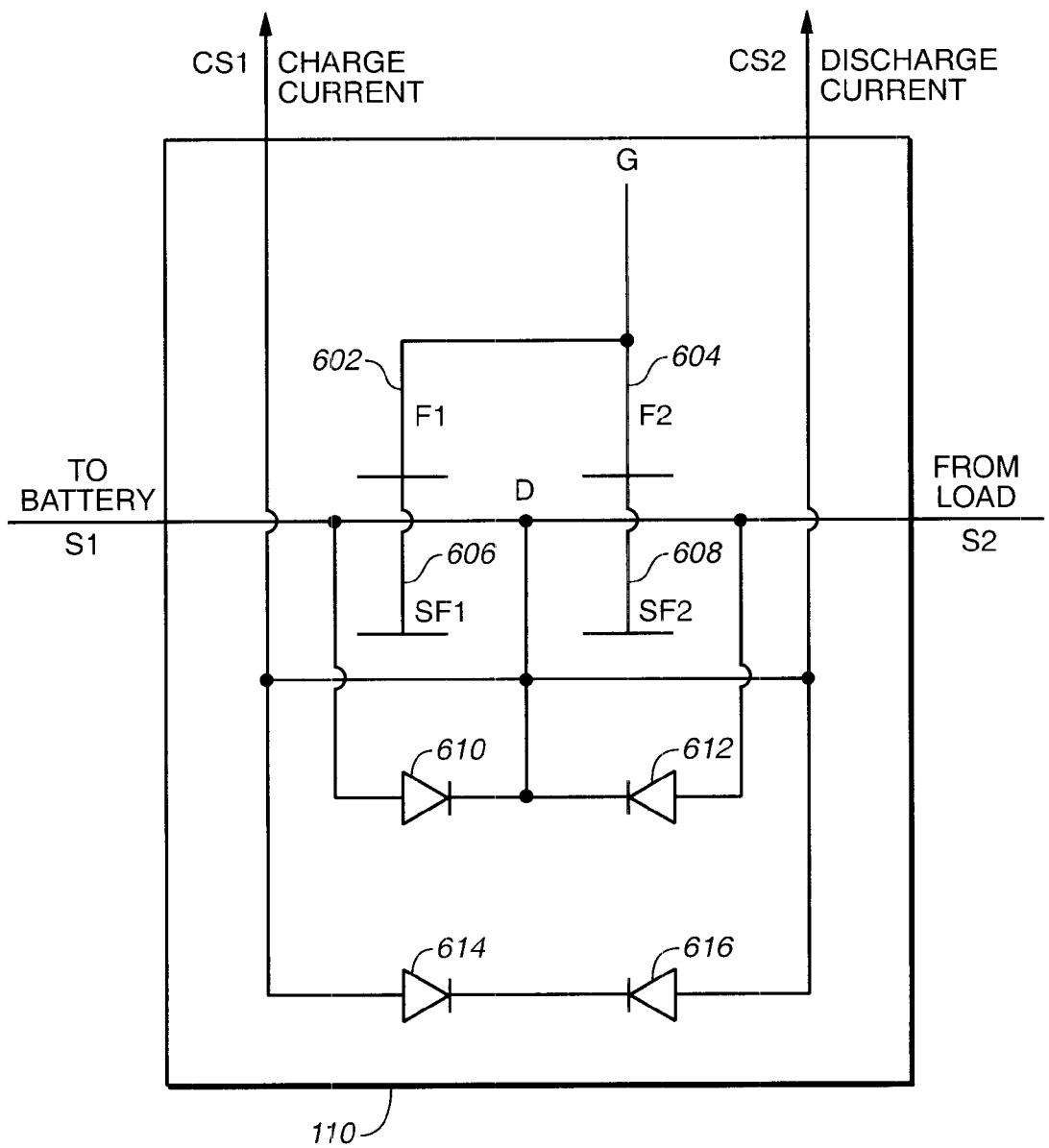
FIG._6

METHOD AND APPARATUS FOR MEASUREMENT OF CHARGE IN A BATTERY

CROSS-REFERENCE TO RELATED APPLICATIONS

This application is a continuation-in-part application of, and claims priority to, U.S. Provisional Application Serial No. 60/159,227, filed on Oct. 13, 1999.

ADDITIONAL REFERENCES

Incorporated by reference herein is the Xicor "Smart Battery Fuel Gauge/Safety Device For Cellular Phone Packs" technical reference, U.S. patent application Ser. No. 09/620,308, entitled "Serial Interface for a Battery Management System," assigned to the assignee of the present invention, and U.S. patent application Ser. No. 09/620,089, entitled "Battery Management System," assigned to the assignee of the present invention. Xicor, Inc. is located at 1511 Buckeye Drive, Milpitas, Calif. 95035.

TECHNICAL FIELD

The present invention relates generally to electronic devices and more particularly to a method and apparatus for monitoring the charging and discharging of a battery.

BACKGROUND OF THE INVENTION

Rechargeable batteries are used in many applications to power a variety of devices. Different devices will discharge rechargeable batteries at different rates depending on the function being performed by the device and corresponding load being applied across the battery terminals. For example, a portable computer may discharge a rechargeable battery quickly when computing complex graphic calculations on a processor and rendering a graphic image on a display. The same portable computer may discharge the rechargeable battery more slowly when it is placed in "stand-by mode" and operation of the computer is temporarily suspended. Even when the portable computer is turned off, the rechargeable battery may also continue to discharge a small amount of current over time due to the internal resistance present in the battery.

Generally, the rechargeable battery is charged with a transformer that converts current from a conventional electrical outlet or automobile lighter into direct current suitable for charging the battery. Once the rechargeable battery reaches a maximum voltage, it is fully charged. To protect both the rechargeable battery and the electronic device that it powers, it is important to carefully monitor and control the charging and discharging processes. Specifically, a battery can overheat and be damaged during the charge cycle if it is charged beyond the specified battery capacity. Overcharging can also harm the electronic device as well as people handling the device if the battery leaks or is damaged. In the discharge cycle, for example, an electronic device may be damaged if a short develops within the battery or the device and the sudden increase in current causes the battery or device to overheat or melt.

The device used to measure the charge/discharge state of a battery is popularly called a "gas gauge." Like the gas gauge on an automobile, the battery gas gauge measures how much charge is stored in a battery. Conventional gas gauge devices measure the current flow into and out of the rechargeable battery to measure the battery's charge. These conventional gas gauges detect the current flow using a fixed resistor coupled in series between the battery and the load. The voltage drop across the series resistor is directly proportional to the current flow measurements into or out of the rechargeable battery. Unfortunately, this series resistor, though typically very small in size, consumes a significant portion of the available power delivered by the rechargeable battery over time. Moreover, a small series resistor cannot be used to accurately detect the wide range of currents drawn by many of the electronic devices. That is, the voltage drop produced by the very small series resistor may only be accurately detected when the current flow is high. If the current flow is low, most conventional gas gauges may inaccurately measure the very small voltage drop across this very small resistor. For example, the conventional gas gauge may not accurately detect the lower current used when a computer is placed in "stand-by" mode. Although the series resistor size can be increased to increase measurement accuracy, the larger series resistor will also increase the power lost across the series resistor and, at high currents, further reduce the voltage available to drive the load.

Conventional gas gauges also have difficulty determining the battery charge when a battery is used over long periods of time. These gas gauge devices must keep an accurate time base to integrate the current charge and discharge over time and determine the remaining battery charge. Consequently, accurate battery charge measurement depends on how accurately a conventional gas gauge measures elapsed time over several days or, in some cases, several months of battery usage. Keeping an accurate time basis generally requires additional circuitry and added complexity in the design of the gas gauge.

Even if battery charge and other information related to charging a battery were available it is difficult to communicate these facts with other devices. The battery and charger typically cannot communicate with other devices because there are no standards for such communication. Further, even with communication standards provided, they are difficult and expensive to implement for typical applications.

SUMMARY OF THE INVENTION

In one aspect of the invention, a charge measurement apparatus for use in a rechargeable battery powered system includes a bi-directional integrated power and sense field effect transistor (FET) having first and second power FETs operatively coupled to a rechargeable battery, a bias signal, a common node and a load and first and second sense FETs operatively coupled to provide mirror charge and discharge currents, a gas gauge circuit that uses the mirror charge current to measure a total charge into the rechargeable battery, uses the mirror discharge current to measure a total discharge from the rechargeable battery and determines the charge level in the rechargeable battery based on the total charge and the total discharge.

Another aspect of the invention includes a charge measurement apparatus for a rechargeable battery powered system including an integrated power and sense device having a power device and a sense device, connected to the rechargeable battery and a load; the sense device operatively coupled to provide a mirror current that is a fixed ratio of the current in the power device, and a first circuit that uses the mirror current to measure the charge in the rechargeable battery.

Yet another aspect of the invention includes a charge measurement apparatus for a rechargeable battery powered system including a bi-directional integrated power and sense device connected to the rechargeable battery and a load, wherein bi-directional integrated power and sense device includes first and second power devices and first and second sense devices, the first sense device operatively coupled to provide a mirror charge current which is a fixed ratio of the current in the first power device, the second sense device operatively coupled to provide a mirror discharge current which is a fixed ratio of the discharge current in the second power device, and a first circuit that uses the mirror charge and discharge currents to determine the charge into and discharge from the rechargeable battery.

In another aspect of the invention, a method of measuring current flow in a rechargeable battery includes providing a integrated power and sense device having a power device and a sense device, providing a mirror current from the sense device that is an accurate ratio of the current flowing in the power device and the rechargeable battery, and measuring the charge in the rechargeable battery using the mirror current.

BRIEF DESCRIPTION OF THE DRAWINGS

FIG. 1 is a block diagram of a rechargeable battery powered system using a battery management system to control charge and discharge of a battery consistent with the present invention.

FIG. 2 is a block diagram illustrating the components used in the Battery Management Unit (BMU) portion of FIG. 1 to manage charging and discharging of a battery.

FIG. 3 is a diagram illustrating a gas gauge circuit used to measure the charge into and out of a battery during charge and discharge cycles.

FIG. 4 is a block diagram of the interface control unit (ICU) portion of the BMU of FIG. 2.

FIG. 5 is a pulse diagram that indicates the start, acknowledge, zero, and one conditions used by a serial protocol in the battery charger system.

FIG. 6 is a circuit diagram illustrating a bi-directional sense FET used to generate mirror currents for measuring the battery charge.

DETAILED DESCRIPTION

FIG. 1 provides a block diagram of a battery management system 100. Battery management system 100 includes a rechargeable battery, hereinafter battery 102, a battery management unit (BMU) 104, a load 106, a charger unit 108 for charging battery 102, and a switch and sensor unit (SSU) 110. In one implementation, BMU 104 and SSU 110 are integrated together in a single chip using customized analog, non-volatile memory, and logic circuits. Consistent with the present invention, BMU 104 and SSU 110 can be implemented by distributing logic functions to different components or using a programmable controller or central processor and bus. In general, integrating the components in battery management system 100 together makes using the system more efficient and cost-effective in a wider variety of electronic applications.

Battery

Battery 102 is a rechargeable battery typically used in electronic devices such as computers, cameras, personal digital assistants (PDA), or power tools. Battery 102 can be designed using a variety of materials including Nickel Cadmium (NiCd), Nickel Hydride (NiH), and Lithium Ion (Li). A positive terminal and negative terminal on battery 102 is operatively coupled to the corresponding terminals of load 106 and provides current to operate load 106. In one implementation, battery 102, BMU 104, SSU 110, and charger unit 108 can be designed and assembled as an integrated "smart battery" for use in electronic devices. Alternatively, BMU 104 and SSU 110 can be developed separately as discrete components and then programmed through the serial port, discussed in further detail below, to operate with existing batteries.

Battery Management Unit

BMU 104 monitors safety conditions within battery management system 100 including over voltage, under voltage, over current, and operating temperature and communicates this information to a host over serial interface 111. BMU 104 is operatively coupled to battery 102, SSU 110, load 106, and charger unit 108. Referring to FIG. 2, BMU 104 includes a battery safety unit (BSU) 202, a charge monitor, hereinafter referred to as a gas gauge 204, an interface and control unit (ICU) 206, a bus 214 and memory 208 having data 210 and battery status 212.

BSU 202 can include an integrated temperature sensor and logic for processing temperature information associated with battery 102 and other components. In one implementation, a pn-diode attached to BMU 104 is used to measure temperature fluctuations in the system. The pn-diode can be used as a temperature sensor by measuring the voltage variation that occurs in the pn-diode as the temperature fluctuates. Alternatively, an external temperature sensor such as a thermocouple, thermistor or diode can be used to detect the temperature of battery 102 in FIG. 1.

In addition to internal logic associated with the integrated temperature sensor and corresponding logic, BSU 202 may also rely on an arithmetic unit 408 (see FIG. 4) in ICU 206 to perform calculations. Further, BSU 202 may store temperature, voltage, and current threshold values in local registers or over bus 214 and into memory 208. Preferably, bus 214 acts as a transport mechanism for transferring data between components within BMU 104. For example, BSU 202 may use bus 214 to access memory 208, communicate with ICU 206, and transmit a special "Temp P" signal over serial interface 111 when the measured temperature exceeds a predetermined value or goes below a predetermined value. This "Temp P" signal allows external devices to receive the device temperature end value.

To measure an over current condition, BSU 202 monitors the rate at which battery 102 charges and discharges. Referring now to FIG. 1 and FIG. 2, the over charge protection (OCP) input from gas gauge 204 provides a digital signal each time a unit of charge goes through battery 102. A simple timing circuit determines if the rate of charging or discharging exceeds a predetermined threshold and may cause damage to battery 102, load 106 or other components.

BSU 202 compares voltage, current and temperature conditions with predetermined levels and operates to turn off the current flowing into or out of battery 102 using SSU 110 if a threshold is exceeded. In addition, BSU 202 also can issue a warning to the host by changing status bits in battery status 212. In the event a safety condition occurs when the current from load 106 is reduced and the host is suspended or in a "sleep" condition, BSU 202 can also transmit a predetermined safety signal to ICU 206 that a host device external to BMU 104 can detect. For example, BSU 202 may instruct ICU 206 to transmit a signal on serial interface 111 associated with ICU 206 indicating the specific safety or alarm condition. In one implementation, the safety or alarm condition can be transmitted to the host by holding a single wire serial interface associated with ICU 206 low for a period of 1 msec, indicating to the host that a safety condition has occurred and needs attention. The single wire interface is discussed in further detail below.

The predetermined threshold values associated with over voltage, under voltage, over current, and operating temperatures can be programmed in BMU 104 to accommodate the specific operating characteristics of battery 102. These levels can be initially programmed into BMU 104 during assembly and before shipment to the customer.

Gas Gauge

Gas gauge 204 uses S1, S2, CS1 and CS2 inputs to accurately sense the current flow in SSU 110. Inputs CS1 and CS2 provide a sense current proportional to the current passing through battery 102. Proportional currents, such as the proportional sense current, are also referred to as ratioed currents. By measuring the charge passing through inputs CS1 and CS2, gas gauge 204 can determine the total charge in battery 102. The remaining capacity of the battery is then determined by comparing the expected capacity of the battery with the measured charge. Gas gauge 204 can also keep track of the total charge into battery 102 and total discharge from battery 102. The charge information can be used to determine if the total capacity of a battery is being diminished over time and the battery needs replacing. For example, a battery is not holding a charge well when the difference between the total discharge and total charge of a battery exceeds a predefined threshold. In one implementation, gas gauge 204 updates a predetermined storage location in memory 208 to hold the total charge and total discharge charge information.

Referring now to FIG. 1 and FIG. 3, an exemplary circuit used in gas gauge 204 is shown that measures a mirror current passing through input CS1 as battery 102 charges. A similar circuit attached to input CS2 can be used to measure the discharge from battery 102. To better illustrate how gas gauge 204 operates, a portion of the circuitry from SSU 110 is also included in FIG. 3. The portion of SSU 110 illustrated in FIG. 3, which is generally separate and external to gas gauge 204, includes a power transistor 602 and a sense transistor 606. Operation of power transistor 602 and sense transistor 606 in SSU 110 are described in further detail below along with the operation of SSU 110.

Gas gauge 204 includes a current integrator section 301 and a charge counter section 311. Current integrator section 301 includes a comparator 302, a voltage source 304, a transistor 306, a transistor 308, and a capacitor 310. Charge counter section 311 includes a comparator 312, a transistor 322, an inverter 316, and a counter 318.

Within current integrator section 301, the negative terminal of comparator 302 is coupled to receive input S1 and the positive terminal of comparator 302 is coupled to receive input CS1. Input S1 is coupled to the source of power transistor 602. The current used to charge battery 102 passes through power transistor 602. Input CS1 is coupled to the source of the sense transistor 606 and carries a mirror current proportional to the current used to charge battery 102. Further, input CS1 is also coupled through transistor 306 to voltage source 304 labeled VB1.

Output VB2 from comparator 302 is coupled to the gates of transistor 306 and transistor 308. Voltage source 304 is coupled to the sources of transistor 306 and 308; thus transistor 308 is a current mirror of transistor 306. The drain of transistor 308 is coupled to the drain of transistor 322, the positive terminal of capacitor 310, and the negative terminal of comparator 312 used by charge counter 311. The source of transistor 322 is coupled to ground and the drain of transistor 322 is coupled to the positive terminal of capacitor 310. The negative terminal of capacitor 310 is coupled to ground and the positive terminal of capacitor 310 receives mirror current from transistor 308.

Within current counter 311, comparator 312 is coupled to receive input VB3 at its positive terminal and provide its output to the input of inverter 316. An output from inverter 316 is coupled to an input on counter 318 and the gate of transistor 322 such that it increments the counter and switches transistor 322.

During the battery charge cycle, current integrator section 301 detects the charge and charge counter section 311 measures the total charge. Initially, the current used to charge battery 102 flows through power transistor 602. Comparator 302 compares the voltage on input S1 with the voltage at input CS1. If the voltage differs, comparator 302 generates a voltage VB2 such that transistor 306 turns on and delivers more current to input CS1. The voltage generated by comparator 302 at output VB2 forces the voltage on input CS1 to equal the voltage at input S1. As a consequence, current through input CS1 is an accurate ratio of the current through power transistor 602 (the battery current).

The exact proportions of the currents are determined by the relative sizes of the power and sensing transistors 602 and 606, respectively. Specifically, the transistors can be sized such that the mirror current is ratioed differently for different amounts of current. For example, if the current is very small the ratio of the transistor sizes may be reduced such that the sense current is more sensitive to small currents. In one implementation, the transistors are field effect transistors (FETs) or MOSFETs sized so that the mirror current is approximately $\frac{1}{1000}$th of the current passing through power transistor 602 and battery 102. Alternatively, the transistors could be sized such that the mirror current is as large as $\frac{1}{100}$ of the current passing through the power transistors.

The voltage VB2 from comparator 302 also turns on transistor 308, producing a proportional mirror current that can be used to charge capacitor 310. The charging of capacitor 310 integrates the mirror current from transistor 308. Consequently, capacitor 310 measures charge without using a time base. When the charge on capacitor 310 matches the voltage on input VB3, a unit of charge has been measured and comparator 312 generates a pulse on its output.

This pulse causes inverter 316 to increment counter 318 indicating an additional unit of charge has been added to battery 102 by charger unit 108. After each unit of charge is measured, the pulse on the output of comparator 312 turns on transistor 322 and discharges capacitor 310. This prepares capacitor 310 to receive another unit of charge before the charge measurement process described above repeats. If the dimensions of transistor 306 and transistor 308 are equal, the current through transistor 308 mirrors the current through transistor 306 and is proportional to the current in power transistor 602. In an alternate implementation, transistor 308 can be sized to receive less current from current source 304. This alternate implementation would also use a proportionally smaller capacitor 310 and would consume less power in measuring the battery charge.

The value in counter 318 represents a charge proportional to the charge the battery has received during a charge cycle. Accordingly, one can calculate how much the battery has been charged and whether the battery is at full capacity. Because capacitor 310 continuously integrates the current, gas gauge 204 can measure the battery charge without a time measurement or time period for sampling. Further, gas gauge 204 can accurately measure mirror currents ranging from picoAmp to milliAmp.

In an alternate implementation, separate counters can be used to measure the amount a battery has been charged or discharged. Instead of using a single counter such as counter 318, the two counters can keep track of the total charge entering and leaving the battery. To determine the net charge of the batter, the value in one counter is subtracted from the value in the second counter. The two counters can also be used to determine information such as the number of battery cycles for charging.

Interface and Control Unit (ICU)

Referring to FIG. 1 and FIG. 4, a block diagram illustrating ICU 206 is shown. Components within ICU 206 manage alarms and safety condition threshold values, processes requested from external host devices, arithmetic operations and results, and communications with host devices over serial interface 111. In accordance with one implementation of the invention, ICU 206 includes serial interface logic 402, interrupt logic 404, alarm logic 406, and arithmetic unit 408.

Serial Interface Logic

Serial interface logic 402 includes logic for using a serial protocol over a serial interface 111, between a master and a slave device as well as processing commands transmitted over the serial interface. For example, serial interface logic 402 detects commands, and transmits appropriate signals to operate components within BMU 104. The serial protocol embedded in serial interface logic 402 defines a transmitter as a device that sends data on the serial interface 111 and a receiver as a device that receives the data. Further, the device controlling the transfer is a master and the device being controlled is the slave. The master device always initiates data transfers and provides the starting commands for both the transmit and receive operations.

In one implementation, BMU 104 operates as a slave unit to an external master device and the serial interface 111 on BMU 104 is set to receive mode on power up. For the master unit to begin communication with the slave, the master issues a start signal followed by a command byte and the address associated with a byte of data to be accessed in memory 208. The receiving slave unit responds by sending an acknowledge signal between each command. Similarly, the master also responds to the slave with an acknowledge signal each time the master receives 8 bits of data. BMU 104 uses serial interface 111 associated with serial logic 402 to carry data between an external master device and memory 208. Serial interface 111 operates in a half duplex mode and memory 208 can include a variety of storage devices such as a 4K E²PROM, a 512 bit E²PROM look up table (LUT), a 256 bit non-volatile random access memory (NovRAM) or a 128 bit one-time-programmable (OTP) unit.

Referring to FIG. 5, a pulse diagram indicates a start, acknowledge (ACK), one, and zero signals used by the serial protocol. The serial protocol provides BMU 104 a mechanism for communicating information related to the operation of BMU 104. BMU 104 uses this protocol over a single conductor connected between BMU 104 and a device external to BMU 104. The protocol uses a sequence of pulses on the single conductor where the number of pulses corresponds to the signals being transmitted.

Start signal 504 in FIG. 5 indicates the start of information transmission over the single conductor connected to BMU 104. For example, the start command generally precedes a command. In one implementation, the start command consists of five pulses each having a low duration of 30 microseconds. Each pulse is separated by a high duration lasting 30 microseconds. The last high duration lasts at least 90 microseconds indicating transmission for the start signal is complete. In operation, BMU 104 monitors serial interface 111 for this start signal and will not respond to any command or data until this condition is detected. Start signal 504 can also be used to terminate the input of a control byte or the input data to be written. This will reset the device and leave it ready to begin a new read or write command. It is worth noting that start signal 504 cannot be generated while BMU 104 is outputting data.

Ack signal 506 is a signal used to indicate successful transfer of information using the communication protocol. For example, a device transmitting information to BMU 104 releases the single conductor connected to BMU 104 after transmitting a series of eight data bits and during the ninth bit period, BMU 104 sends an ack (short for "acknowledge") signal 506. This acknowledge condition notifies the transmitting device that the receiving device has received the eight bits of data. In one implementation, ack signal 506 is a sequence of four pulses each having a low duration of 30 microseconds. Each pulse is separated by a time interval having a high duration of 30 microseconds. Like start signal 504, ack signal 506 is complete when a high duration time interval lasting at least 90 microseconds is transmitted. BMU 104 responds with ack signal 506 after receiving start signal 504 and after transmitting each byte to the master.

One signal 508 indicates transmission of a data value of one. In one implementation, three pulses are transmitted for one signal 508 as indicated in FIG. 5. Each pulse has a low duration of 30 microseconds separated by a high duration of 30 microseconds.

Zero signal 510 indicates transmission of a data value of zero. Two pulses are transmitted for zero signal 510 as indicated in FIG. 5. Like other signals described above each pulse used in one signal 508 and zero signal 510 has a low duration of 30 microseconds and is separated by a time interval with a high duration 30 microseconds. The last high duration time interval lasts at least 90 milliseconds and indicates that the signal has completed transmission.

When serial interface 111 remains idle for a time interval longer than 1 millisecond., serial interface logic 402 resets serial interface 111. With the exception of interrupting a write to memory, serial interface logic 402 resets serial interface 111 regardless of transmission state being sent or the signal level being transmitted (i.e., high or low). For example, a reset may occur if an idle period greater than 1 millisecond occurs in the middle of a data communication session with a host. Specifically, ICU 206 when not being driven by either a master or slave device sets serial interface 111 to a high value. Accordingly, the master device must reissue a start signal to resume communication once a reset occurs.

The master device can issue a variety of commands once a start signal is successfully received by serial interface logic 402. In one implementation, eight bit commands are transmitted over serial interface 111 using a sequence of pulses as described above. Each command byte contains bits C0 through C7 and operates to perform the following list of operations or functions:

| | |
|---|---|
| C0 bit- | Read or write command to the selected memory |
| C1 bit- | Upper half or lower half selection of a memory block array Future use |
| C3 bit- | Select Novram |
| C4 bit- | Lock or Unlock page write from high voltage |
| C5 bit- | Arithmetic operations (extrapolation) |
| C6 bit- | Interrupt Operations |
| C7 bit- | Program and control auxiliary locations |

Interrupt Logic

Referring to FIGS. 1, 2 and 4, interrupt logic 404 processes external command requests occurring while BMU 104 is performing one or more internal functions. For example, interrupt logic 404 determines how to process an external command given to BMU 104 while the gas gauge is updating the battery charge level or arithmetic unit 408 is performing a calculation. Interrupt logic 404 supports concurrent interrupts and may also generate an interrupt compatible with a personal computer (i.e., IRQn). This IRQ interrupt signal can also be transmitted separately over a second communication line (not shown).

In one implementation, interrupt logic 404 allows BMU 104 to complete the internal operations without interruption and sets a status bit in a status register stored in memory 208 indicating that a conflict with an internal operation has occurred. Interrupt logic 404 does not send an acknowledge signal to the master device making the request. Instead, it is up to the master device to read the status register, determine if a conflict has occurred, and reissue the command. In practice, the master device may need to reissue the external command several times before the internal operations within BMU 104 are completed and the external command can be performed. If the master device does not read the status register, the status bit remains set until a subsequent read status register command issues.

Alarm Logic

Alarm logic 406 is operable to process safety and alarm conditions that occur in BSU 202. In one implementation, alarm logic 406 includes 8 user programmable alarms and 2 safety conditions for detecting over voltage and under voltage conditions. The user can program the alarms to monitor a variety of conditions. For example, alarms can be programmed to monitor battery voltage and over current conditions as charging or discharging occurs or alternatively may be programmed to monitor specific temperature levels of the battery or circuitry within battery management system 100. An over voltage safety condition is programmed to detect a maximum voltage level in battery 102 while the under voltage safety condition can be programmed to detect an under voltage condition. When a safety condition level or alarm level is reached, ICU 206 stores status information in the status register. Typically, the status register is at a fixed location in data 210 or battery status 212.

To program alarms or safety conditions in BMU 104, a "Write Enable" command must be issued over serial interface 111. Moreover, once the alarms and other thresholds in BMU 104 have been programmed, a "Disable Write" command must be issued over serial interface 111 in a similar manner to prevent any future accidental write.

In one implementation, BSU 202, gas gauge 204, and ICU 206 are integrated together as a single unit such as BMU 104. By placing BMU 104 in test mode, input OCP, input PTC, input CS1, input CS2, input Vcc, and serial interface 111 can be used to select and program alarms and other threshold values. When BMU 104 is not in test mode, BSU 202 operates normally and these inputs and outputs operate as described above. In one implementation, raising serial interface 111 on ICU 206 to a high voltage such as 12V for a period of 10 millisecond sets BSU 202 in test mode. The over voltage safety level can be reset by setting the input PTC high and holding input OCP, input CS1 and input CS2 pins low. The voltage protection level can be set by setting the voltage on the Vcc pin to the desired over voltage protection level.

Similarly, to set the over voltage safety levels to a new value, the input PTC and input CS2 are held high while the input OCP and input CS1 pins are held low. Raising the serial port on ICU 206 to a high voltage such as 12V for 10-millisecond programs the over voltage protection level to the voltage level set on Vcc. Similar operations can be used to set the under voltage and over current safety levels in BMS 100. Temperature safety levels are set in BMS 100 by writing a maximum and minimum temperature safety level in a predetermined memory location within data 210 of memory 208. Specifically, the digital value of the desired temperature safety levels can be transmitted through serial interface 111, described above.

Arithmetic Unit

Arithmetic unit 408 in FIG. 2 performs calculations within BMU 104. For example, arithmetic unit 408 performs calculations such as adding a predetermined battery capacity to the gas gauge during charge time or subtracting the same capacity from gas gauge during discharge time. Further, arithmetic unit 408 can be used to extrapolate data between two discrete values. If battery capacity data in BMU 104 only exists for two temperature values such as 25° C. and 100° C. and the measured temperature is 70° C., arithmetic unit 408 can extrapolate the battery capacity data for 70° C., based on the available capacity values associated with the two known temperature values. This allows BMU 104 to provide a more accurate prediction of the remaining battery capacity given a wider range of temperatures.

Memory

Referring to FIG. 2, memory 208 stores threshold information and other data for use by BMU 104 and includes data 210 and battery status 212. In one implementation, data 210 includes a status register and a look-up-table. The status register stores safety conditions such as over voltage, over current, under voltage, minimum temperature, maximum temperature, special conditions such as battery capacity full and conflict information (i.e., interrupt flag), 8 alarm conditions, and at least one status flag reserved for customization. The look-up-table (LUT) includes information such as a list of discrete operating temperatures in 5–15 degree increments from 100° C. down to −20° C. and specific parameters related to operation of battery 102 (FIG. 1), such as rated charge count per 1 milliamp-hr, rated capacity, count period value, temp correction count period, battery self discharge value, temperature (temp) correction self discharge, temp point capacity reduction, temp rate capacity reduction, hi current point capacity (cap) reduction, hi current rate cap reduction, cycle A and cycle B count multiplier, total charge/discharge multipliers, alarms setup, maximum temp safety level, minimum temp safety level, and watch dog time and over current (OC) control. The charge/discharge multipliers help determine the ability to recharge a battery.

Battery status 212 can include a separate status register, a "gas" gauge for the battery, cycle A and cycle B registers, total charge registers, total discharge registers, and user defined registers.

Sensor and Switch Unit (SSU)

Referring to FIG. 1, SSU 110 detects the current passing through battery 102 to protect the battery and circuitry as well as measure the charge in battery 102. If BMU 104 detects a current condition outside predetermined limits, BMU 104 sends a signal to SSU 110 over power transistor control (PTC) input to shut off the current to battery 102.

SSU 110 also facilitates measuring the charge in battery 102. Specifically, SSU 110 generates mirror currents on inputs CS1 and CS2 directly proportional to the current flow charging or discharging battery 102. These mirror currents are used by gas gauge 204 in BMU 104 to measure the charge into and out of battery 102 and indicate the charge level in the battery.

FIG. 6 illustrates a bi-directional sense FET 600 included in SSU 110 to facilitate generating the mirror currents through inputs CS1 and CS2. Bi-directional sense FET 600 includes a power transistor (FET) 602, a power FET 604, a sense transistor (FET) 606, a sense FET 608, a diode 610, a diode 612, a diode 614, and a diode 616. The source of power FET 602 is coupled to the input of diode 610 and the source power FET 604 is coupled to the input of diode 612. The output of diode 610 and diode 612 are coupled to the drains of power FET 602 and power FET 604 as well as the drain of sense FET 606 and the drain of sense FET 608. The source of sense FET 606 is coupled to the input of diode 614 and to input CS1. The source of sense FET 608 is coupled to the input of diode 616 and to input CS2. Outputs from diode 614 and diode 616 are coupled together.

Referring now to FIGS. 1, 2 and 6, bi-directional sense FET 600 uses sense FET 606 and sense FET 608 to measure the charge current flowing through power FET 602 or the discharge current flowing in the opposite direction through power FET 604. When BMU 104 is operating normally, BSU 202 provides a voltage to the gate of each FET 602, 604, 606 and 608 such that the FETs are biased on and the charge or discharge current flows through SSU 110. Alternatively, if an alarm or safety condition occurs, BSU 202 (FIG. 2) shuts off each FET to prevent further charging or discharging of battery 102.

When battery 102 discharges current, the current flows from the source (S2) to the drain (D) of power FET 604 through the drain (D) and source (S1) of power FET 602 and to the negative terminal of battery 102. Gas gauge 204 supplies current to input CS2 such that the voltage at input CS2 equals the voltage at input S2. When this voltage condition occurs, the current through input CS2 is an accurate ratio of the current flowing through SSU 110 to battery 102. The mirror current through input CS2 is used to measure the charge from the battery during a discharge cycle.

When battery 102 is being charged, the current flows from the source (S1) to the drain (D) of power FET 602 through the drain (D) and source (S2) of power FET 604 and to the negative terminal of the charger unit 122. As discussed above, gas gauge 204 supplies current to input CS1 such that the voltage at input CS1 equals the voltage at input S1. Under this condition, the current through input CS1 is an accurate ratio of the current flowing through SSU 110 to battery 102. The mirror current passing through input CS1 is used to measure the charge to the battery during a charge cycle.

Battery Management Operation

Referring again to FIG. 1, BMU 104 operates during charge and discharge cycles. During the charge cycle, charger unit 108 provides current flow through the positive terminal of battery 102, through the battery and SSU 110, returning to the negative terminal of charger unit 108. SSU 110 develops a mirror current through input CS1, which tracks the charging of battery 102. If the charge current measured by BMU 104 remains within a prescribed operating range, BMU 104 continues to bias transistors in SSU 110 such that battery 102 receives current from charger unit 108. Typically, charger unit 108 converts alternating current from an electrical socket into appropriate direct current suitable for charging battery 102. In one implementation, charger unit 108 can also be integrated into BMU 104 as an additional component for use when power for charger unit 108 is available. If charger unit 108 is on and load 106, such as a computer system, is in use, then charger unit 108 will support load 106 and partially charge battery 102.

In discharge mode, battery 102 provides a current to load 106. Charger unit 108 is typically not present when battery 102 discharges. During discharge, current flows from the positive terminal of battery 102, through the corresponding positive terminal of load 106, through load 106, and from the negative terminal of load 106 into SSU 110. SSU 110 develops mirror current through input CS2 that tracks the discharging of battery 102.

If battery 102 becomes overcharged, BMU 104 will detect an over voltage condition in battery 102. Specifically, BMU 104 compares the voltage value provided over the Vcc input with a predetermined threshold voltage value associated with the battery. If the voltage value on the Vcc input exceeds this threshold value, BMU 104 signals to SSU 110 over the PTC output to cutoff current flow to battery 102. This will also cause SSU 110 to switch off the mirror current flow through input CS1.

Other embodiments are also within the scope of the following claims. For example, the order of steps of the invention may be changed by those skilled in the art and still achieve desirable results and various thresholds and parameters can be modified. Further, a bi-directional FET is used to measure current but a resistor could be used to measure current as well as an FET that is not bi-directional or other devices and circuits equivalent to a sense FET device. Although n-channel devices in the SSU connected to the negative battery terminal (low-side) have been described, alternative implementations can use p-channel devices in the SSU. Either n-channel or p-channel devices can be connected to either the positive or negative battery terminal depending on the configuration.

What is claimed is:

1. A charge measurement apparatus for use in a rechargeable battery powered system, comprising:

a bi-directional integrated power and sense field effect transistor (FET) having first and second power FETs operatively coupled to a rechargeable battery, a bias signal, a common node and a load, and first and second sense FETs operatively coupled to provide mirror charge and discharge currents;

a gas gauge circuit that uses the mirror charge current to measure a total charge into the rechargeable battery, uses the mirror discharge current to measure a total discharge from the rechargeable battery and determines the charge level in the rechargeable battery based on the total charge and the total discharge.

2. A charge measurement apparatus for a rechargeable battery powered system comprising:

an integrated power and sense device having a power device and a sense device, connected to the rechargeable battery and a load;

the sense device operatively coupled to provide a mirror current that is a fixed ratio of the current in the power device; and a first circuit that uses the mirror current to measure the charge in the rechargeable battery.

3. The apparatus of claim 2, further includes a second circuit that uses the mirror current to detect an over current condition and generate a disconnect signal.

4. The apparatus in claim 3, wherein the power device is responsive to the disconnect signal and disconnects the rechargeable battery.

5. The apparatus in claim 2, wherein the integrated power and sense device is a sense transistor.

6. The apparatus in claim 5, wherein the sense transistor is a sense FET.

7. The apparatus in claim 5, wherein the sense FET is a P Channel FET.

8. The apparatus in claim 5, wherein the sense FET is a N Channel FET.

9. The apparatus in claim 2, wherein the integrated power and sense device is connected to the positive terminal of the rechargeable battery.

10. The apparatus in claim 2, wherein the integrated power and sense device is connected to the negative terminal of the rechargeable battery.

11. The apparatus in claim 2, wherein the first circuit measures charge by integrating the mirror current without requiring the time base.

12. The apparatus of claim 11, wherein the first circuit uses a capacitor to integrate the mirror current and measure the charge.

13. The apparatus of claim 12, wherein the first circuit further includes a reference voltage operatively coupled to a comparator to measure a unit of charge on the capacitor.

14. A charge measurement apparatus for a rechargeable battery powered system comprising:
   a bi-directional integrated power and sense device connected to the rechargeable battery and a load, wherein bi-directional integrated power and sense device includes first and second power devices and first and second sense devices;
   the first sense device operatively coupled to provide a mirror charge current which is a fixed ratio of the current in the first power device;
   the second sense device operatively coupled to provide a mirror discharge current which is a fixed ratio of the discharge current in the second power device; and
   a first circuit that uses the mirror charge and discharge currents to determine the charge into and discharge from the rechargeable battery.

15. The apparatus of claim 14, further including a second circuit that uses the mirror charge and discharge currents to detect over current conditions and generates a disconnect signal.

16. The apparatus in claim 15, wherein at least one power device is responsive to the disconnect signal and disconnects the rechargeable battery.

17. The apparatus in claim 14, wherein the bi-directional integrated power and sense device is a bi-directional sense transistor.

18. The apparatus in claim 17, wherein the bi-directional sense transistor is a bi-directional sense FET.

19. The apparatus in claim 18, wherein the bi-directional sense FET is a bi-directional P Channel FET.

20. The apparatus in claim 18, wherein the bi-directional sense FET is a bi-directional N Channel FET.

21. The apparatus in claim 14, wherein the bi-directional integrated power and sense device is connected to the positive terminal of the rechargeable battery.

22. The apparatus in claim 14, wherein the bi-directional integrated power and sense device is connected to the negative terminal of the rechargeable battery.

23. The apparatus in claim 14, wherein the first circuit measures charge to the battery by integrating the mirror charge current and measures discharge from the battery by integrating the mirror discharge current without requiring the time base.

24. The apparatus of claim 23, wherein the first circuit uses a first capacitor to integrate the mirror charge current and measure the charge and a second capacitor to integrate the mirror discharge current and measure the discharge.

25. The apparatus of claim 24, wherein the first and second circuits further include a first and second comparator coupled to at least one reference voltage to measure a unit of charge on the first capacitor and a unit of charge on the second capacitor.

26. The apparatus of claim 25, wherein the outputs from the first and second comparators are coupled to first and second counters and used to count units of charge into and units of discharge from the rechargeable battery respectively.

27. The apparatus of claim 26, wherein the output from the counters is used to determine the total charge into and total discharge out of a battery.

28. The apparatus of claim 27, wherein the outputs from the counters are used to determine the charge level in a battery.

29. A method of measuring current flow in a rechargeable battery comprising:
   providing a integrated power and sense device having a power device and a sense device;
   providing a mirror current from the sense device that is an accurate ratio of the current flowing in the power device and the rechargeable battery; and
   measuring the charge in the rechargeable battery using the mirror current.

30. The method of claim 29, wherein the charge measured is used to determine the total charge into the rechargeable battery.

31. The method of claim 29, wherein the charge measured is used to determine the total discharge from the rechargeable battery.

32. The method of claim 29, wherein the charge measured is used to determine the charge level of the rechargeable battery.

* * * * *